US008246301B2

(12) United States Patent
Li

(10) Patent No.: US 8,246,301 B2
(45) Date of Patent: Aug. 21, 2012

(54) FAN ASSEMBLY

(75) Inventor: Zhan-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 515 days.

(21) Appl. No.: 12/482,077

(22) Filed: Jun. 10, 2009

(65) Prior Publication Data

US 2010/0232976 A1 Sep. 16, 2010

(30) Foreign Application Priority Data

Mar. 10, 2009 (CN) ...................... 2009 2 0301182 U

(51) Int. Cl.
*H05K 7/00* (2006.01)
(52) U.S. Cl. .................................... 415/213.1
(58) Field of Classification Search ............... 415/213.1, 415/214.1; 361/690, 694, 695, 696, 687
See application file for complete search history.

(56) References Cited

U.S. PATENT DOCUMENTS

| | | | |
|---|---|---|---|
| 6,190,197 B1* | 2/2001 | Polgar et al. ................ | 439/527 |
| 6,592,327 B2* | 7/2003 | Chen et al. ................ | 415/213.1 |
| 7,048,498 B2* | 5/2006 | Kosugi ........................... | 415/118 |
| 2006/0203447 A1* | 9/2006 | Kyle et al. ..................... | 361/695 |
| 2008/0075589 A1* | 3/2008 | Chen et al. ................ | 415/213.1 |
| 2008/0101019 A1* | 5/2008 | Tao ................................ | 361/695 |
| 2009/0009961 A1* | 1/2009 | Li .................................. | 361/687 |
| 2009/0059521 A1* | 3/2009 | Yin ............................... | 361/695 |
| 2010/0232976 A1* | 9/2010 | Li ............................. | 416/244 R |
| 2012/0027579 A1* | 2/2012 | Wu et al. .................... | 415/213.1 |
| 2012/0027580 A1* | 2/2012 | Lu et al. ..................... | 415/214.1 |

* cited by examiner

*Primary Examiner* — Edward Look
*Assistant Examiner* — Christopher R Legendre
(74) *Attorney, Agent, or Firm* — Altis Law Group, Inc.

(57) ABSTRACT

A fan assembly includes a side panel, a mounting panel and a fan module. The side panel defines a vent. The mounting panel is perpendicularly attached to the side panel. A retaining opening is defined in the mounting pane. The fan module includes a fan and a retaining member. The fan is configured for generating airflow towards the vent. The retaining member is attached to the fan module. The retaining member includes a body and an arm. The body includes a resilient portion. A protrusion protrudes from the resilient portion corresponding to the retaining opening. The arm is connected to the resilient portion. The arm is capable of being actuated to pull the resilient portion to deform away from the mounting panel to disengage the protrusion from the retaining opening.

18 Claims, 5 Drawing Sheets

FAN ASSEMBLY

BACKGROUND

1. Technical Field

The disclosure generally relates to a fan assembly, especially to a fan assembly within a server enclosure for dissipating heat from electronic components.

2. Description of Related Art

In the computer industry, a computer system, such as a server, is often configured to facilitate reliable and continuous operation. Computer systems typically have multiple power supplies and fans, and each device is usually screwed to the server chassis. If one of these components fails or malfunctions, the component may affect continuing operation of the system until a service technician can replace the failed component. Heat dissipation devices, such as fans, are provided in conventional computers to remove heat from heat generation components. These fans are usually screwed to racks adjacent to the heat generation components in the computers. The assembly is time-consuming.

DETAILED DESCRIPTION

Figure 1:
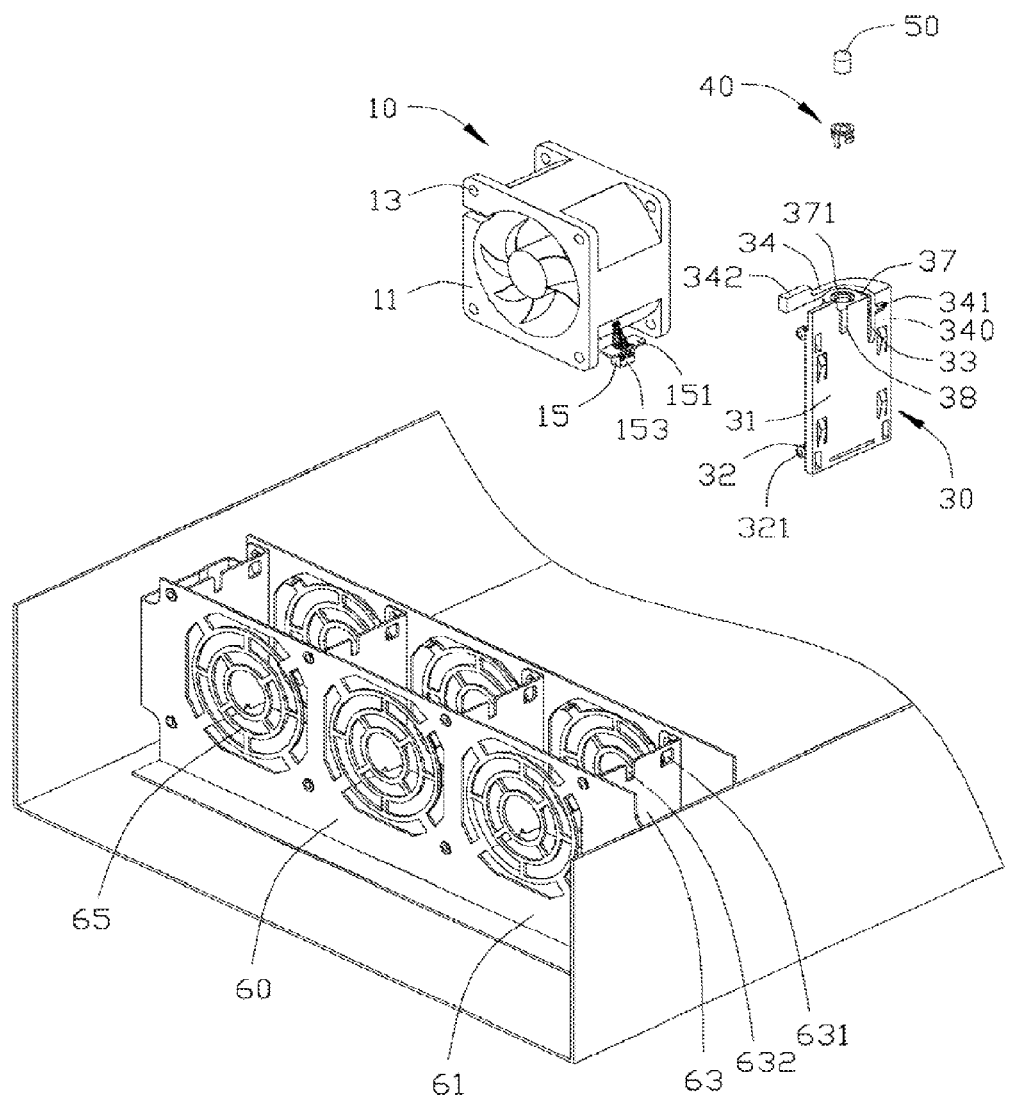
FIG. 1 is a partially exploded, isometric view of a fan assembly according to an embodiment.

Referring to FIG. 1, a fan assembly of an embodiment can be placed within a chassis for dissipating heat from an electronic component (not shown). The fan assembly includes a plurality of fan modules and a fan bracket 60 for receiving the fan modules. Each fan module includes a fan 10 and a retaining member 30.

The fan bracket 60 includes two parallel side panels 61, and a plurality of mounting panels 63 sandwiched between the two side panels 61. The plurality of mounting panels 63 are perpendicularly arranged to the side panels 61. A plurality of receiving rooms in the fan bracket 60 are defined by the plurality of mounting panels 63 and the side panel 61. Each side panel 61 defines a plurality of vents 65 for conducting airflow. A cutout 632 is defined in a top edge of each of the plurality of mounting panels 63. A square retaining opening 632 is defined in each of the plurality of mounting panels 63.

The fan 10 is configured for generating airflow towards the vents 65. Each fan 10 includes two sidewalls 11. Each sidewall 11 defines four retaining holes 13 at four corners thereof. The fan 10 includes a connector 15 for supplying power. The connector 15 includes a securing plate 151 and a head portion 153.

Figure 2:
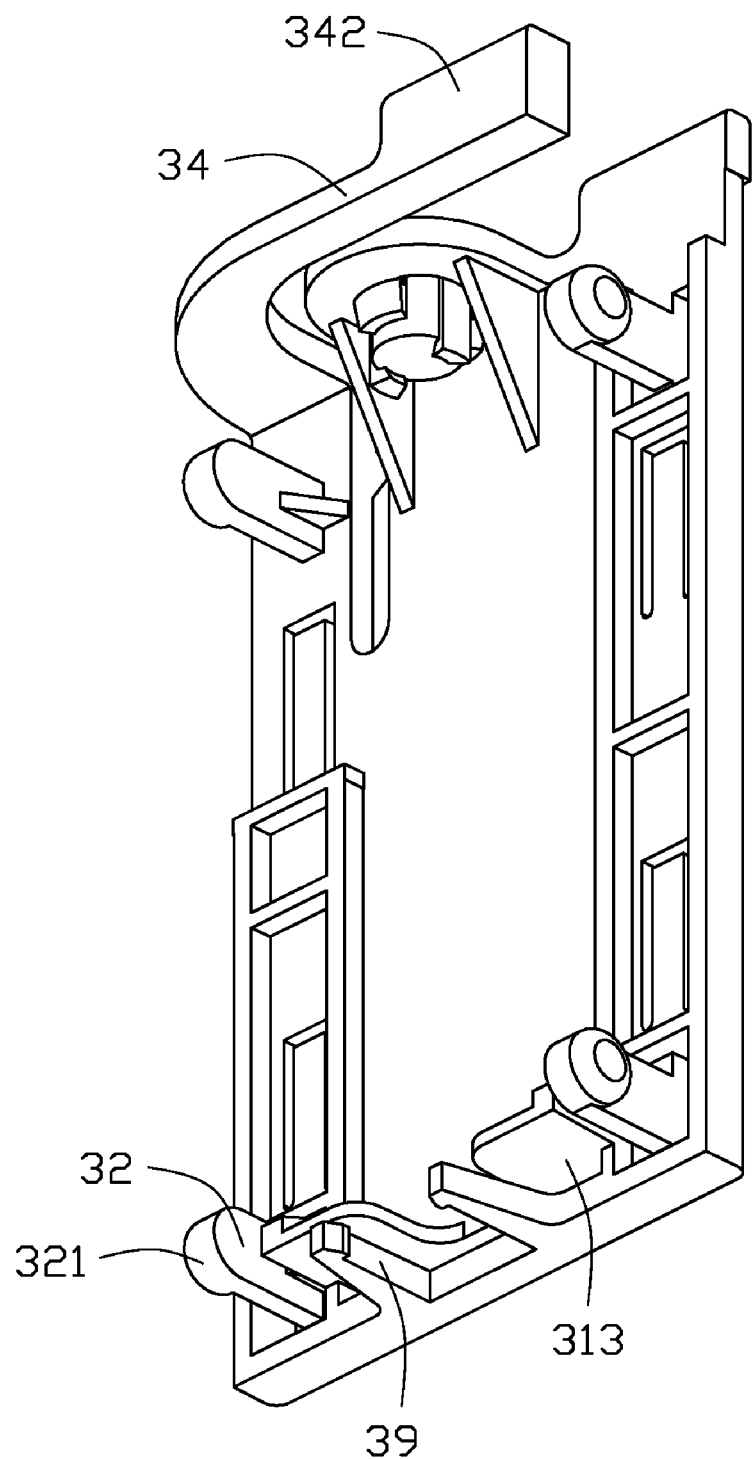
FIG. 2 is an enlarged, isometric view of a retaining member of FIG. 1.

Referring to FIG. 1 and FIG. 2, the retaining member 30 includes a body 31, an arm 34, a supporting portion 37 perpendicularly extending from the body 31. The body 31 defines an extension slot 33 to form a resilient portion 340. The arm 34 is connected to a free end of the resilient portion 340. A wedge-shaped protrusion 341 protrudes from the resilient portion 340 corresponding to the retaining opening 631. A positioning bulge 38 protrudes from the body 31 corresponding to the cutout 632. Four resilient locking tabs 32 protrude from the body 31. Each locking tab 32 includes a post 321 corresponding to the retaining hole 13 of the fan 10. A block portion 313 and a pair of resilient clasps 39 are formed on a bottom portion of the body 31.

The arm 34 has an arcuate configuration. The arm 34 includes a pressing portion 342. The supporting portion 37 has a rounded surface towards the arm 34. The arm 34 is configured as a lever with the arm 34 pivoting about the supporting portion 37 to pull the resilient portion 340. A through hole 371 is defined in the supporting portion 37 for receiving the indicator light module. The indicator light module includes an indicator light 50 and a latch 40 for retaining the indicator light 50. The indicator light 50 may receive power through the connector 15 of the fan 10 or from an attached battery on an inner surface of the body 31 of the retaining member 30 to indicate that the fan 10 is in operation.

Figure 3:
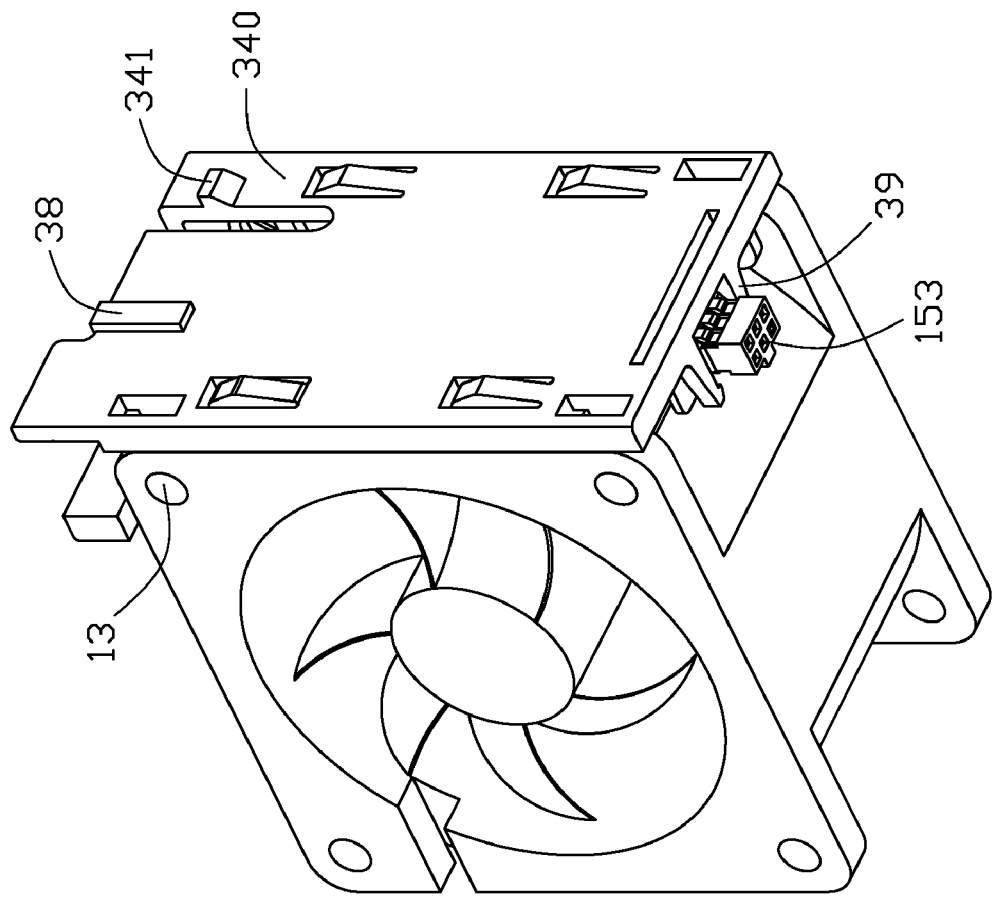
FIG. 3 is an assembled, isometric view of a fan module of FIG. 1.

Referring to FIG. 3, in assembling the fan module, the retaining member 30 is mounted on one side of the fan 10 parallel to an airflow direction of the fan 10. The four locking tabs 32 are deformed inwardly, so that the posts 321 are received in the corresponding retaining holes 13 on one side of the fan 10. The securing plate 151 is sandwiched between the block portion 313 and the resilient clasps 39. The head portion 151 is clasped by the clasps 39. The indicator light module is received in the through hole 371 of the supporting portion 37.

Figure 4:
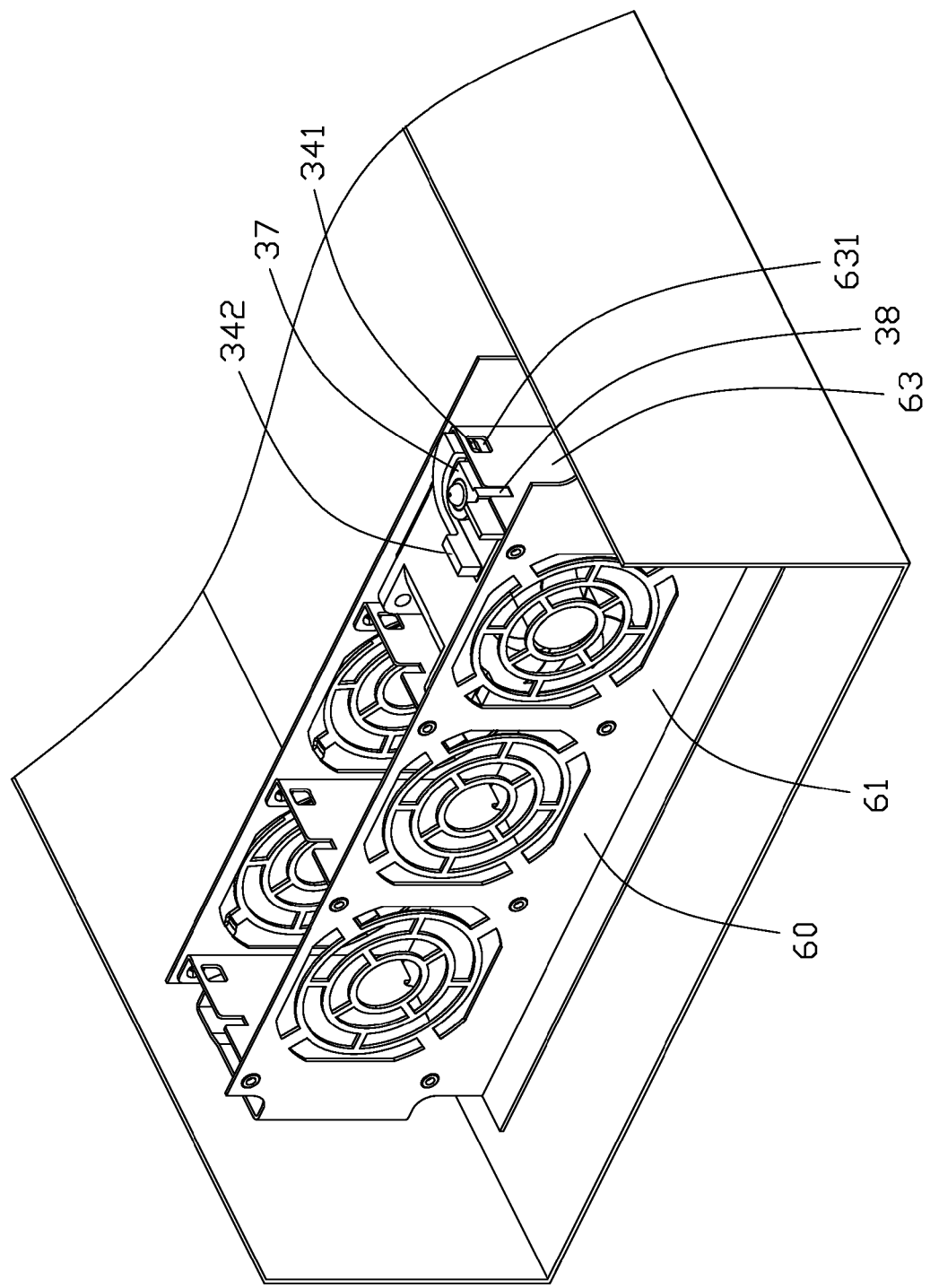
FIG. 4 is an assembled, isometric view of FIG. 1.

Referring to FIG. 4, when assembling the fan module to the fan bracket 60, the fan module is moved from up to down into one of the plurality of receiving rooms of the fan bracket 60. The positioning bulge 38 slides into the cutout 632 of the mounting panel 63. When the wedge-shaped protrusion 341 abuts on a top edge of the mounting panel 63, the resilient portion 340 deforms and the arm 34 moves inward towards the fan 10. When the fan module is completely moved into the fan bracket 60, the protrusion 341 slides into the retaining opening 631 and the resilient portion 340 deforms back to an original state. The fan module is then assembled into the fan bracket 60.

Figure 5:
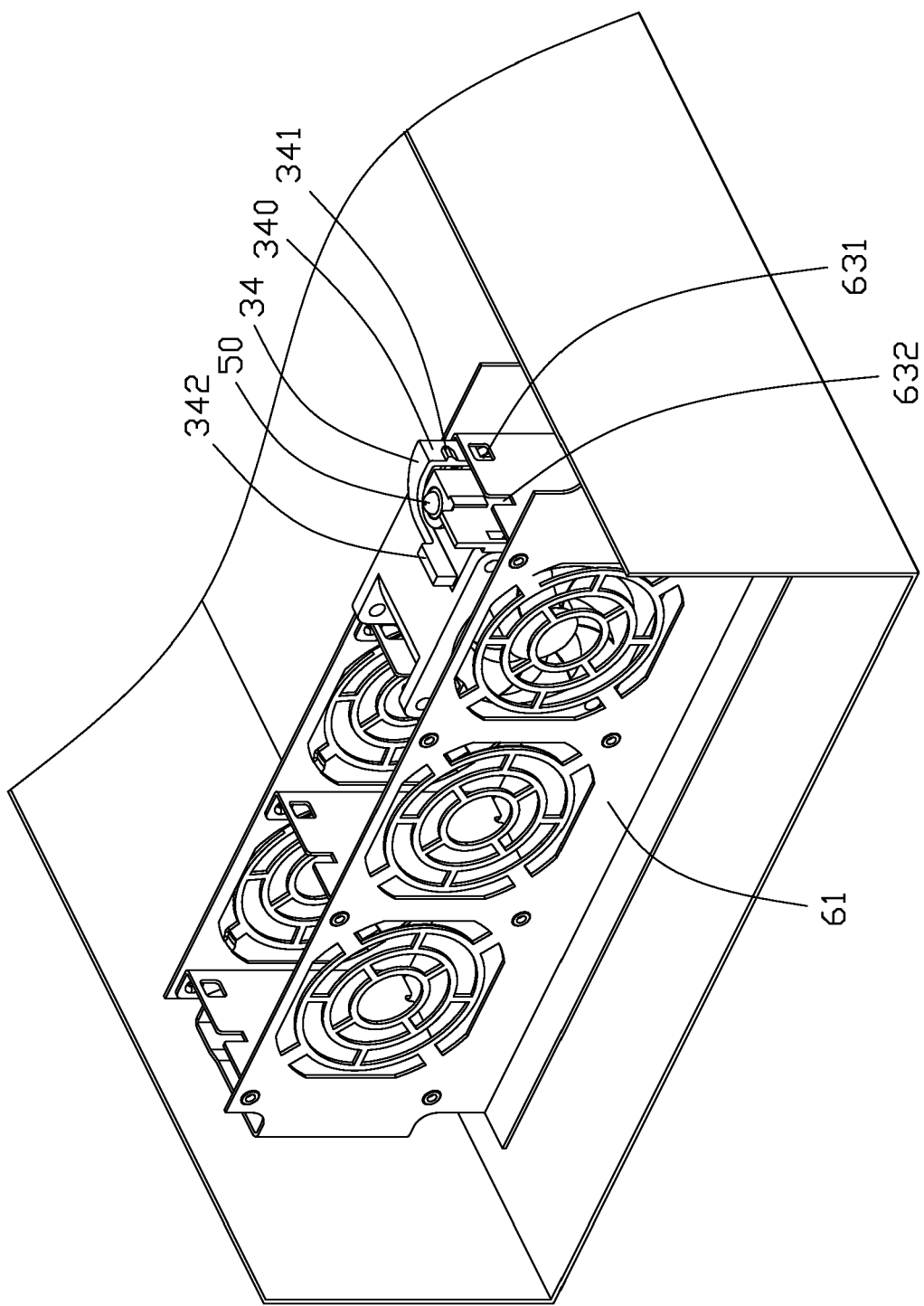
FIG. 5 is similar to FIG. 4, but the fan module is moved slightly upward.

Referring to FIG. 5, when removing the fan module from the bracket 60, the pressing portion 342 of the arm 34 is pressed to move towards the body 31. The arm 34 is tilted by the supporting portion 37 to pull the free end of the resilient portion 341 to move away from the mounting panel 63. The protrusion 341 disengages from the retaining opening 631. Then the fan module is removed from the fan bracket 60.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan assembly comprising:
   at least one side panel defining a vent;
   at least one mounting panel, perpendicularly attached to the side panel, comprising:
   a retaining opening; and
   a fan module comprising:
   a fan; and
   a retaining member attached to the fan module, the retaining member comprising a body and an arm, the body comprising a resilient portion, a protrusion protruding from the resilient portion corresponding to the retaining opening of the at least one mounting panel, the arm connected to the resilient portion, wherein the arm is capable of being actuated to drive the resilient portion to deform away from the mounting panel to disengage the protrusion from the retaining opening, the retaining member further comprises a supporting portion perpendicularly extending from the body, and the arm is actuated to pivot about the supporting portion and drive the resilient portion to deform away from the mounting panel when a distal end of the arm moves towards the supporting portion.

2. The fan assembly of claim 1, wherein the arm has an arcuate configuration.

3. The fan assembly of claim 1, wherein the supporting portion has a rounded surface.

4. The fan assembly of claim 1, wherein the retaining member further comprises an indicator light module received in a through hole defined in the supporting portion.

5. The fan assembly of claim 1, wherein an extension slot is defined in the body to form the resilient portion.

6. The fan assembly of claim 1, wherein a cutout is defined in the mounting panel, and a positioning bulge protrudes from the body and corresponds to the cutout.

7. The fan assembly of claim 1, wherein the fan module comprises a connector, the connector comprises a securing plate and a head portion; a block portion and a pair of resilient clasps are formed on the body; the securing plate is capable of being sandwiched between the block portion and the resilient clasps, and the head portion is capable of being clasped by the clasps.

8. A fan assembly comprising:
a mounting panel, a retaining opening defined in the mounting panel;
a retaining member for retaining a fan, the retaining member comprising a body, a supporting portion and an arm; the body comprising a resilient portion, and a protrusion protruding from the resilient portion corresponding to the retaining opening; the arm being connected to the resilient portion;
wherein the arm is adapted to rotate relative to the supporting portion to pull the resilient portion to move away from the mounting panel to disengage the protrusion from the retaining opening, the arm extends in a plane which is substantially perpendicular to the resilient portion, and the arm is adapted to move within the plane.

9. The fan assembly of claim 8, wherein the arm has an arcuate configuration.

10. The fan assembly of claim 8, wherein the supporting portion has a rounded surface.

11. The fan assembly of claim 8, wherein the retaining member further comprises an indicator light module received in a through hole defined in the supporting portion.

12. The fan assembly of claim 8, wherein an extension slot is defined in the body to form the resilient portion.

13. The fan assembly of claim 8, wherein a cutout is defined in the mounting panel, and a bulge protrudes from the body and corresponds to the cutout.

14. The fan assembly of claim 8, wherein the fan module comprises a connector, the connector comprises a securing plate and a head portion; a block portion and a pair of resilient clasps are formed on the body; and the securing plate is capable of being sandwiched between the block portion and the resilient clasps, and the head portion is capable of being clasped by the clasps.

15. A fan assembly comprising:
a mounting panel, a retaining opening defined in the mounting panel;
a retaining member for retaining a fan, the retaining member comprising a body, a supporting portion, an arm and an indicator light module received in the supporting portion; the body comprising a resilient portion, and a protrusion protruding from the resilient portion corresponding to the retaining opening; the arm being connected to the resilient portion;
wherein the arm is adapted to rotate relative to the supporting portion to pull the resilient portion to move away from the mounting panel to disengage the protrusion from the retaining opening.

16. The fan assembly of claim 15, wherein the supporting portion perpendicularly extends from the body, and the arm is actuated to pivot about the supporting portion and drive the resilient portion to deform away from the mounting panel when a distal end of the arm moves towards the supporting portion.

17. The fan assembly of claim 15, wherein the arm extends in a plane which is substantially perpendicular to the resilient portion, and the arm is adapted to move within the plane.

18. The fan assembly of claim 17, wherein the arm has an arcuate configuration.

* * * * *